US012603642B2

(12) United States Patent
Stojakovic et al.

(10) Patent No.: US 12,603,642 B2
(45) Date of Patent: Apr. 14, 2026

(54) ELECTRICAL ASSEMBLY FOR CONNECTION WITH BATTERY AND ELECTRICAL LOAD

(71) Applicant: Aptiv Technologies AG, Schaffhausen (CH)

(72) Inventors: Nikola Stojakovic, Windsor (CA); John Caputo, Boardman, OH (US); Jay Junkin, Madison Heights, MI (US)

(73) Assignee: Aptiv Technologies AG, Schaffhausen (CH)

( * ) Notice: Subject to any disclaimer, the term of this patent is extended or adjusted under 35 U.S.C. 154(b) by 97 days.

(21) Appl. No.: 18/418,829

(22) Filed: Jan. 22, 2024

(65) Prior Publication Data

US 2025/0239999 A1     Jul. 24, 2025

(51) Int. Cl.
*H03K 3/0231*     (2006.01)
*H03F 3/45*       (2006.01)
*H03K 5/24*       (2006.01)

(52) U.S. Cl.
CPC ....... *H03K 3/0231* (2013.01); *H03F 3/45475* (2013.01); *H03K 5/2481* (2013.01); *H03F 2200/261* (2013.01)

(58) Field of Classification Search
CPC ................ H03K 3/0231; H03K 5/2481; H03F 3/45475; H03F 2200/261; G01R 31/2607; G01R 31/3277; G01R 31/2621; G01R 31/26

See application file for complete search history.

(56) References Cited

U.S. PATENT DOCUMENTS

| | | | | |
|---|---|---|---|---|
| 11,211,928 B1 * | 12/2021 | Valero | ...................... | H02J 4/00 |
| 2021/0099167 A1 | 4/2021 | Kempitiya | | |
| 2022/0173657 A1 | 6/2022 | Ramorini | | |
| 2023/0060718 A1 | 3/2023 | Wolfgang | | |

OTHER PUBLICATIONS

Extended European Search Report for EP24211089.8 dated Apr. 4, 2025, 7 pages.

* cited by examiner

*Primary Examiner* — Jung Kim
(74) *Attorney, Agent, or Firm* — Miller Johnson

(57)     ABSTRACT

An electrical assembly configured for connection with a battery and an electrical load includes a first transistor, a second transistor, a first operational amplifier (op-amp), a second op-amp, a comparator, and a controller. The second transistor is electrically connected in parallel with the first transistor. The first operational amplifier (op-amp) is electrically connected with the first transistor and the second transistor. The second op-amp is electrically connected with the first transistor and the second transistor. The comparator is electrically connected with the first op-amp and the second op-amp. The controller is electrically connected with the first transistor, the second transistor, and the comparator. The controller is configured to control the first transistor and the second transistor and determine an operational status of the first transistor and the second transistor based on an output of the comparator.

18 Claims, 6 Drawing Sheets

200

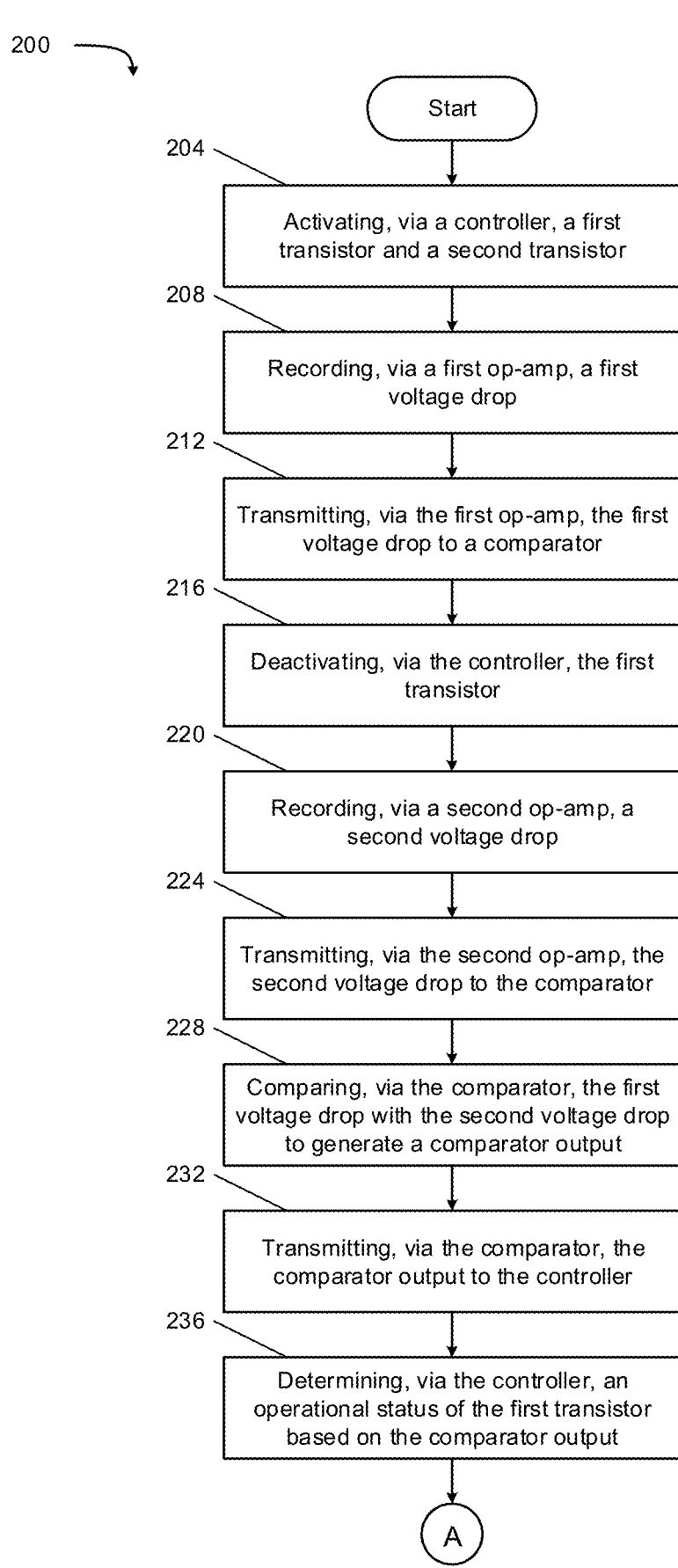

Start

204
Activating, via a controller, a first transistor and a second transistor

208
Recording, via a first op-amp, a first voltage drop

212
Transmitting, via the first op-amp, the first voltage drop to a comparator

216
Deactivating, via the controller, the first transistor

220
Recording, via a second op-amp, a second voltage drop

224
Transmitting, via the second op-amp, the second voltage drop to the comparator 228
Comparing, via the comparator, the first voltage drop with the second voltage drop to generate a comparator output 232
Transmitting, via the comparator, the comparator output to the controller 236
Determining, via the controller, an operational status of the first transistor based on the comparator output

ELECTRICAL ASSEMBLY FOR CONNECTION WITH BATTERY AND ELECTRICAL LOAD

FIELD

The present disclosure relates to electrical assemblies and more particularly to electrical assemblies that are configured to identify fault conditions in connection with vehicles.

BACKGROUND

Modern vehicles (e.g., automobiles) rely on electrical devices to identify fault conditions associated with various electrical components and/or electrical systems. Some conventional electrical devices only perform checks at the beginning of a drive cycle of a vehicle to identify the presence of a fault condition. While known electrical devices for identifying fault conditions have proven acceptable for their intended purpose, a continuous need for improvement remains in the pertinent art.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure provides an electrical assembly configured for connection with a battery and an electrical load. The electrical assembly includes a first transistor, a second transistor, a first operational amplifier (op-amp), a second op-amp, a comparator, and a controller. The second transistor is electrically connected in parallel with the first transistor. The first operational amplifier (op-amp) is electrically connected with the first transistor and the second transistor. The second op-amp is electrically connected with the first transistor and the second transistor. The comparator is electrically connected with the first op-amp and the second op-amp. The controller is electrically connected with the first transistor, the second transistor, and the comparator. The controller is configured to control the first transistor and the second transistor and determine an operational status of the first transistor and the second transistor based on an output of the comparator.

Another aspect of the disclosure provides a method of operating an electrical assembly configured for connection with a battery and an electrical load. The method includes activating, via a controller, a first transistor and a second transistor. The method includes recording, via a first operational amplifier (op-amp), a first voltage drop across the activated first transistor and the activated second transistor. The method includes deactivating, via the controller, the first transistor. The method includes recording, via a second op-amp, a second voltage drop across the deactivated first transistor and the activated second transistor. The method includes comparing, via a comparator, the first voltage drop to the second voltage drop to generate a comparator output. The method includes transmitting, via the comparator, the comparator output to the controller. The method includes determining, via the controller, an operational status of the first transistor based on the comparator output.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIGS. 5A and 5B are a flowchart depicting an example method for operating an electrical assembly in accordance with the principles of the present disclosure.

In the drawings, reference numbers may be reused to identify similar and/or identical elements.

DETAILED DESCRIPTION

Introduction

Figure 1:
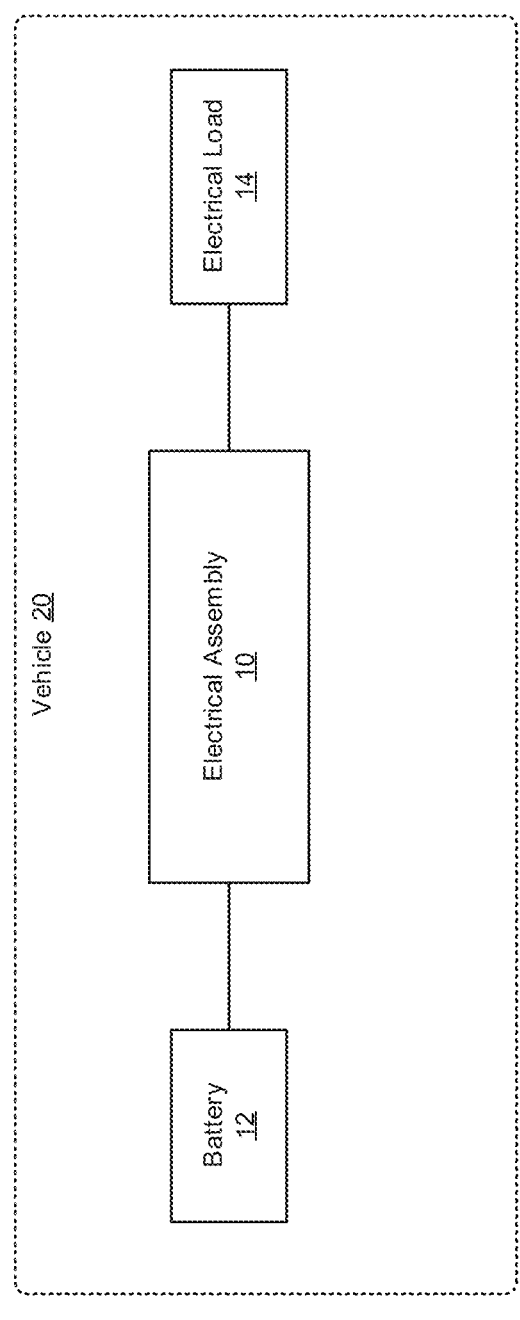
FIG. 1 is a high-level schematic view of an example electrical assembly in accordance with the principles of the present disclosure.

As generally illustrated in FIG. 1, an electrical assembly 10 may be electrically connected with at least one battery 12 and at least one electrical load 14. The electrical assembly 10 may be disposed between the battery 12 and the electrical load 14. In various implementations, the electrical assembly 10 may facilitate supply of electrical current from the battery 12 to the electrical load 14. As explained in more detail below, the electrical assembly 10 performs health checks of certain components of the electrical assembly 10 to identify fault conditions associated with the components. In some examples, the presence of a fault condition may result in the electrical load 14 being supplied high or excessive electrical current, which may cause damage to the electrical load 14. In some instances, the presence of a fault condition may result in the electrical load 14 being supplied low or no electrical current, which may cause the electrical load 14 to operate incorrectly or not at all.

Vehicle

With continued reference to FIG. 1, the electrical assembly 10, the battery 12, and the electrical load 14 may be incorporated with and/or disposed in a vehicle 20, but are not limited to vehicle applications. The vehicle 20 may include one or more of a variety of configurations. For example, a vehicle 20 may include a land vehicle, a passenger car, a van, a sport utility vehicle (SUV), a crossover, a truck (for example, a pickup truck, a commercial truck, etc.), a bus, a watercraft, an aircraft (for example, a plane, a helicopter, etc.), and/or a combination thereof (for example, a vehicle for land and water, a vehicle for air and water, etc.), among others.

Battery

In various implementations, the battery 12 may include one or more of a variety of types. During operation of the electrical assembly 10 and/or the vehicle 20, the battery 12 may supply electrical current to the electrical load 14. The battery 12 may include an output voltage of 12 V, 24 V, and/or 48 V, among others. While the electrical assembly 10 is generally shown and described herein as being connected with one battery, it will be appreciated that the electrical assembly 10 may be connected to more than one battery within the scope of the present disclosure.

In various implementations, in addition to, or alternative to, the electrical assembly 10 being connected with a battery, the electrical assembly 10 may be connected with one or more other power sources, such as a capacitor, a solar panel, a power converter, and/or an outlet, among others.

Electrical Load

In various implementations, the electrical load 14 may include one or more of a variety of configurations. For example, the electrical load 14 may include an electrical system, an electrical subsystem, an electrical device, and/or an electrical component of the vehicle 20. While the electrical assembly 10 is generally shown and described herein as being connected with one electrical load, it will be appreciated that the electrical assembly 10 may be connected to more than one electrical load 14 within the scope of the present disclosure. For example, the electrical assembly 10 may be connected to a plurality of electrical loads.

Electrical Assembly

Figure 2:
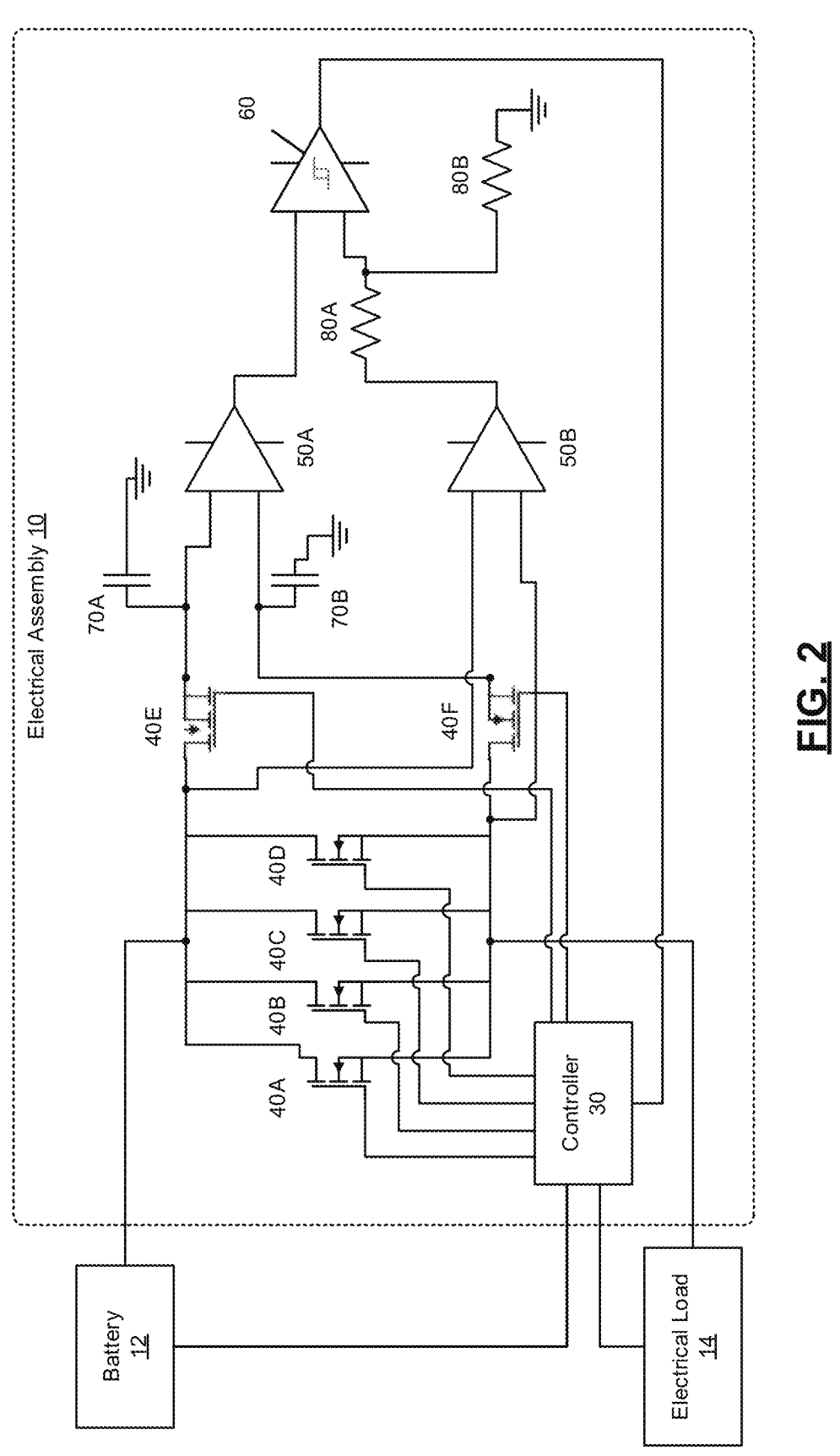
FIG. 2 is a schematic view of an example electrical assembly in accordance with the principles of the present disclosure.

With reference to FIG. 2, the electrical assembly 10 may include a controller 30, a plurality of transistors (e.g., transistors 40A-40F), a first operational amplifier (op-amp) 50A, a second op-amp 50B, a comparator 60, a first capacitor 70A, a second capacitor 70B, a first resistor 80A, and/or a second resistor 80B, among others.

In various implementations, the controller 30 may be electrically connected with the battery 12, the electrical load 14, each transistor of the plurality of transistors (e.g., transistors 40A-40F), and/or the comparator 60. In various implementations, the controller 30 controls each transistor of the plurality of transistors and/or receives outputs from the comparator 60. For example, the controller 30 may selectively activate (e.g., close) a transistor such that electrical current from the battery 12 may flow through the transistor. The controller 30 may selectively deactivate (e.g., open) a transistor such that electrical current form the battery is prevented from flowing through the transistor. In some example configurations, the controller 30 may monitor (e.g., continuously during operation of the vehicle 20) gate voltages of the transistors and/or temperatures of the transistors, among others.

In various implementations, the controller 30 includes an electronic controller and/or an electronic processor, such as a programmable microprocessor and/or microcontroller. The controller 30 may include an application specific integrated circuit (ASIC). The controller 30 may include a central processing unit (CPU), a memory (for example, a non-transitory computer-readable storage medium), and/or an input/output (I/O) interface. The controller 30 may perform various functions, including those described in greater detail herein, with appropriate programming instructions and/or code embodied in software, hardware, and/or other medium. The controller 30 may include a plurality of controllers. The controller 30 may be connected to a display, such as a touch screen.

In various implementations, the plurality of transistors may include a first transistor 40A, a second transistor 40B, a third transistor 40C, a fourth transistor 40D, a fifth transistor 40E, and/or a sixth transistor 40F, among others. In various implementations, each transistor of the plurality of transistors (e.g., transistors 40A-40F) may include a field effect transistor (FET), a metal oxide semiconductor field effect transistor (MOSFET), such as n-channel or p-channel MOSFET, a bipolar junction transistor (BJT), a smart FET, and/or a silicon die (for example, bare silicon die), among others. Each transistor may include a closed (e.g., activated)

state that may permit electrical current to flow from the battery 12 to the electrical load 14. Each transistor may include an open (e.g., deactivated) state that may prevent electrical current from flowing from the battery 12 to the electrical load 14. While the electrical assembly 10 is generally shown and described herein as including six transistors, it will be appreciated that the electrical assembly 10 may include more or less that six transistors within the scope of the present disclosure.

In various implementations, the first transistor 40A, the second transistor 40B, the third transistor 40C, the fourth transistor 40D, the fifth transistor 40E, and the sixth transistor 40F are electrically connected. In some example configurations, the first transistor 40A, the second transistor 40B, the third transistor 40C, and the fourth transistor 40D are connected in parallel. For example, in accordance with at least one of the transistors (e.g., transistors 40A-40D) being in the closed state, electrical current may be permitted to flow from the battery 12 to the electrical load 14. In some example configurations, in accordance with the the fifth transistor 40E and the sixth transistor 40F being in the closed state, electrical current may be permitted to flow to the first op-amp 50A. In accordance with the fifth transistor 40E and the sixth transistor 40F being in the open state, electrical current may be prevented from flowing to the first op-amp 50A.

In various implementations, the first capacitor 70A may be electrically connected with the fifth transistor 40E and the first op-amp 50A and/or the second capacitor 70B may be electrically connected with the sixth transistor 40F and the first op-amp 50A. In some example configurations, the first capacitor 70A may be disposed between the fifth transistor 40E and the first op-amp 50A and/or the second capacitor 70B may be disposed between the sixth transistor 40F and the first op-amp 50A.

In various implementations, the first op-amp 50A may determine and/or record voltage drops associated with (e.g., across) the first transistor 40A, the second transistor 40B, the third transistor 40C, and the fourth transistor 40D in accordance with the fifth transistor 40E, the sixth transistor 40F, and at least one of the first transistor 40A, the second transistor 40B, and the third transistor 40C, or the fourth transistor 40D being in the closed state. The first op-amp 50A may hold the voltage drop via the first capacitor 70A and the second capacitor 70B. In some instances, the voltage drop may be associated with a previous cycle voltage drop of the transistors 40A-40D. The first op-amp 50A may transmit the voltage drops to the comparator 60.

In various implementations, the second op-amp 50B may determine and/or record additional voltage drops associated with (e.g., across) the first transistor 40A, the second transistor 40B, the third transistor 40C, and the fourth transistor 40D in accordance with at least one of the first transistor 40A, the second transistor 40B, and the third transistor 40C, or the fourth transistor 40D being in the closed state. The additional voltage drop may be associated with a real-time voltage drop of the transistors 40A-40D. The second op-amp 50B may transmit the additional voltage drops to the comparator 60.

In various implementations, the comparator 60 may be electrically connected with the first op-amp 50A, the second op-amp 50B, and the controller 30. The comparator 60 may compare the voltage drops transmitted from the first op-amp 50A with the additional voltage drops transmitted from the second op-amp 50B to generate comparator outputs. The comparator 60 may transmit the comparator outputs to the controller 30, for example, for further processing via the controller 30. In some examples, the controller 30 may determine operational statuses of and/or may identify fault conditions of the transistors 40A-40D based on the comparator outputs.

In various implementations, the comparator 60 may compare a voltage drop (i.e., a previous cycle voltage drop) from the first op-amp 50A with an additional voltage drop (i.e., a real-time voltage drop) from the second op-amp 50B to generate a comparator output. In some examples, the comparator output may be high if the voltage drop is greater than the additional voltage drop. The comparator output may be low if the voltage drop is less than or equal to the additional voltage drop.

In various implementations, the first resistor 80A and/or the second resistor 80B may be electrically connected with the second op-amp 50B and the comparator 60. In some example configurations, the first resistor 80A may be disposed between the second op-amp 50B and the comparator 60. The second resistor 80B may be connected to the first resistor 80 and ground. In various implementations, the first resistor 80A and the second resistor 80B may act as a voltage divider.

Operation of Electrical Assembly

Figure 3:
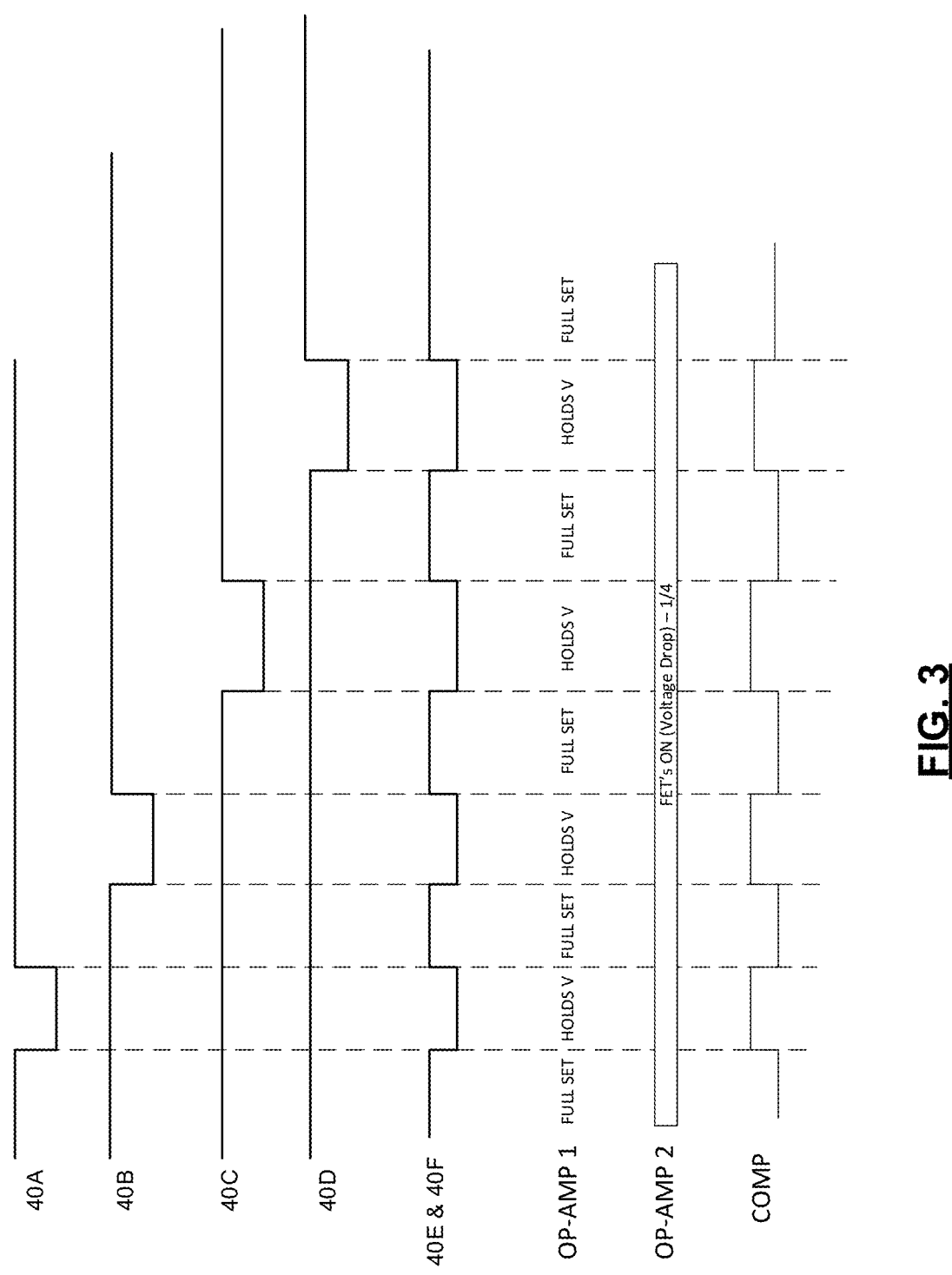
FIGS. 3 and 4 are graphical representations of an electrical assembly performing example health checks in accordance with the principles of the present disclosure.
Figure 4:
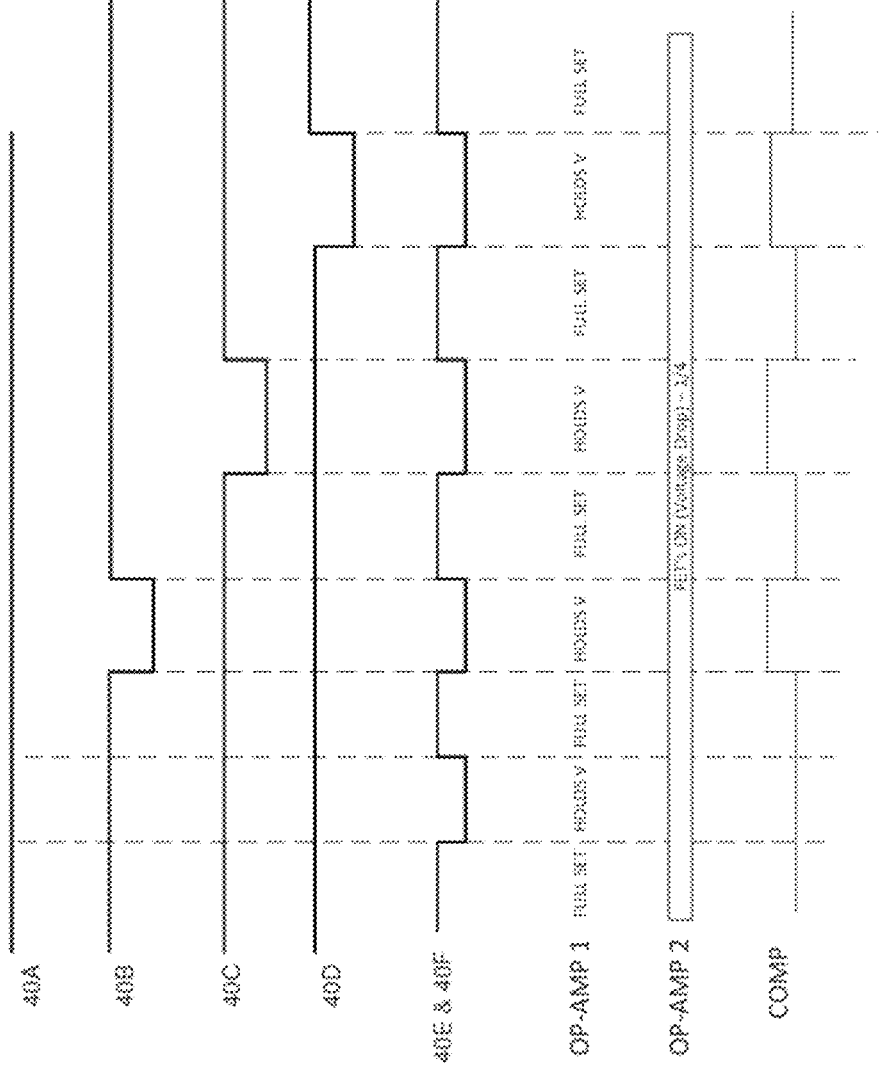

FIGS. 3 and 4 are graphical representations of the electrical assembly 10 performing example health checks. In various implementations, the electrical assembly 10 may perform health checks of the first transistor 40A, the second transistor 40B, the third transistor 40C, and the fourth transistor 40D to determine an operational status of each transistor. The operational status may indicate that a respective transistor is operating correctly or includes a fault condition. A fault condition may be associated with a respective transistor being stuck in a closed or open state, an over-temperature condition, an over-current condition, and/or an insufficient gate voltage condition, among others. FIG. 3 depicts the first transistor 40A, the second transistor 40B, the third transistor 40C, and the fourth transistor 40D operating correctly. FIG. 4 depicts the first transistor 40A including a fault condition (e.g., stuck in the closed state).

In various implementations, the controller 30 may control the first transistor 40A, the second transistor 40B, the third transistor 40C, and/or the fourth transistor 40D in various sequences to execute the health checks. In one example, the controller 30 may initially activate the first transistor 40A, the second transistor 40B, the third transistor 40C, the fourth transistor 40D, the fifth transistor 40E, and the sixth transistor 40F such that the transistors are in the closed state. In accordance with the transistors being in the closed state, the first op-amp 50A may determine and/or record a first voltage drop and the second op-amp 50B may determine and/or record a second voltage drop associated with (e.g., across) the first transistor 40A, the second transistor 40B, the third transistor 40C, and the fourth transistor 40D. The second voltage drop may be substantially similar to the first voltage drop.

In various implementations, the first op-amp 50A may transmit the first voltage drop to the comparator 60 and the second op-amp 50B may transmit the second voltage drop to the comparator 60. The comparator 60 may compare the first voltage drop with the second voltage such to generate a first comparator output. In some examples, the first comparator output may be low because the first voltage drop is less than the second voltage drop.

In various implementations, the first op-amp 50A may hold the first voltage drop (e.g., via the first capacitor 70A and the second capacitor 70B). In some examples, to facilitate the first op-amp 50A holding the first voltage drop, the controller 30 may deactivate (e.g., open) the fifth transistor 40E and the sixth transistor 40F.

In various implementations, the controller 30 may selectively cycle through one transistor (e.g., transistors 40A-40D) at a time to perform a health check for each respective transistor. For example, to perform a health check associated with the first transistor 40A, the controller 30 may deactivate (e.g., open) the first transistor 40A while the second transistor 40B, the third transistor 40C, and the fourth transistor 40D remain in the closed state (e.g., activated). The second op-amp 50B may determine and/or record a third voltage drop associated with (e.g., across) the first transistor 40A being in the open state and the second transistor 40B, the third transistor 40C, and the fourth transistor 40D being in the closed state. The second op-amp 50B may transmit the third voltage drop to the comparator 60.

In various implementations, an input of the second op-amp 50B may be scaled through a voltage divider (e.g., the first resistor 80A and the second resistor 80B) to reduce an output voltage provided via the first transistor 40A, the second transistor 40B, the third transistor 40C, and the fourth transistor 40D by an expected increase in the voltage drop when one of the transistors 40A-40D is deactivated. The scaling may account for a margin of error caused by minor differences in the drain-source on resistances (RDS (on)) of the transistors.

In various implementations, the comparator 60 may compare the first voltage drop with the third voltage drop to generate a second comparator output associated with the operational status of the first transistor 40A. In accordance with the first transistor 40A operating correctly, the second comparator output (e.g., high) will indicate that the first transistor 40A is in the open state (see, e.g., FIG. 3). In accordance with the first transistor 40A including a fault condition (e.g., stuck in the closed state), the second comparator output (e.g., low) will indicate that the first transistor 40A includes the fault condition (see, e.g., FIG. 4).

Subsequently, the controller 30 may activate (e.g., close) the first transistor 40A, the fifth transistor 40E, and the sixth transistor 40F such that the first op-amp 50A may determine and/or record a fourth voltage drop and the second op-amp 50B may determine and/or record a fifth voltage drop associated with (e.g., across) the transistors 40A-40D being in the closed state. The first op-amp 50A may transmit the fourth voltage drop and the second op-amp 50B may transmit the fifth voltage drop to the comparator 60. The comparator 60 may compare the fourth voltage drop with the fifth voltage drop to generate a third comparator output associated with the operational status of the first transistor 40A. In accordance with the first transistor 40A operating correctly, the third comparator output (e.g., low) will indicate that first transistor 40A is in the closed state (see, e.g., FIG. 3).

In various implementations, the first op-amp 50A may hold the fourth voltage drop (e.g., via the first capacitor 70A and the second capacitor 70B). In some examples, to facilitate the first op-amp 50A holding the fourth voltage drop, the controller 30 may deactivate (e.g., open) the fifth transistor 40E and the sixth transistor 40F.

In various implementations, to perform a health check associated with the second transistor 40B, the controller 30 may deactivate (e.g., open) the second transistor 40B while the first transistor 40A, the third transistor 40C, and the fourth transistor 40D remain in the closed state (e.g., activated). The second op-amp 50B may determine and/or record a sixth voltage drop associated with (e.g., across) the second transistor 40B being in the open state and the first transistor 40A, the third transistor 40C, and the fourth transistor 40D being in the closed state. The second op-amp 50B may transmit the sixth voltage drop to the comparator 60.

In various implementations, the comparator 60 may compare the fourth voltage drop with the sixth voltage drop to generate a fourth comparator output associated with the operational status of the second transistor 40B. In accordance with the second transistor 40B operating correctly, the fourth comparator output (e.g., high) will indicate that the second transistor 40B is in the open state (see, e.g., FIG. 3). In accordance with the second transistor 40B including a fault condition (e.g., stuck in the closed state), the fourth comparator output (e.g., low) will indicate that the second transistor 40B includes the fault condition.

Subsequently, the controller 30 may activate (e.g., close) the second transistor 40B, the fifth transistor 40E, and the sixth transistor 40F such that the first op-amp 50A may determine and/or record a seventh voltage drop and the second op-amp 50B may determine and/or record an eighth voltage drop associated with (e.g., across) the transistors 40A-40D being in the closed state. The first op-amp 50A may transmit the seventh voltage drop and the second op-amp 50B may transmit the eighth voltage drop to the comparator 60. The comparator 60 may compare the seventh voltage drop with the eighth voltage drop to generate a fifth comparator output associated with the operational status of the second transistor 40B. In accordance with the second transistor 40B operating correctly, the fifth comparator output (e.g., low) will indicate that second transistor 40B is in the closed state (see, e.g., FIG. 3).

In various implementations, the first op-amp 50A may hold the seventh voltage drop (e.g., via the first capacitor 70A and the second capacitor 70B). In some examples, to facilitate the first op-amp 50A holding the seventh voltage drop, the controller 30 may deactivate (e.g., open) the fifth transistor 40E and the sixth transistor 40F.

In various implementations, to perform a health check associated with the third transistor 40C, the controller 30 may deactivate (e.g., open) the third transistor 40C while the first transistor 40A, the second transistor 40B, and the fourth transistor 40D remain in the closed state (e.g., activated). The second op-amp 50B may determine and/or record a ninth voltage drop associated with (e.g., across) the third transistor 40C being in the open state and the first transistor 40A, the second transistor 40B, and the fourth transistor 40D being in the closed state. The second op-amp 50B may transmit the ninth voltage drop to the comparator 60.

In various implementations, the comparator 60 may compare the seventh voltage drop with the ninth voltage drop to generate a sixth comparator output associated with the operational status of the third transistor 40C. In accordance with the third transistor 40C operating correctly, the sixth comparator output (e.g., high) will indicate that the third transistor 40C is in the open state (see, e.g., FIG. 3). In accordance with the third transistor 40C including a fault condition (e.g., stuck in the closed state), the sixth comparator output (e.g., low) will indicate that the third transistor 40C includes the fault condition.

Subsequently, the controller 30 may activate (e.g., close) the third transistor 40C, the fifth transistor 40E, and the sixth transistor 40F such that the first op-amp 50A may determine and/or record a tenth voltage drop and the second op-amp 50B may determine and/or record an eleventh voltage drop associated with the transistors 40A-40D being in the closed state. The first op-amp 50A may transmit the tenth voltage drop and the second op-amp 50B may transmit the eleventh voltage drop to the comparator 60. The comparator 60 may compare the tenth voltage drop with the eleventh voltage drop to generate a seventh comparator output associated with the operational status of the third transistor 40C. In accordance with the third transistor 40C operating correctly, the seventh comparator output (e.g., low) will indicate that third transistor 40C is in the closed state (see, e.g., FIG. 3).

In various implementations, the first op-amp 50A may hold the tenth voltage drop (e.g., via the first capacitor 70A and the second capacitor 70B). In some examples, to facilitate the first op-amp 50A holding the tenth voltage drop, the controller 30 may deactivate (e.g., open) the fifth transistor 40E and the sixth transistor 40F.

In various implementations, to perform a health check associated with the fourth transistor 40D, the controller 30 may deactivate (e.g., open) the fourth transistor 40D while the first transistor 40A, the second transistor 40B, and the third transistor 40C remain in the closed state (e.g., activated). The second op-amp 50B may determine and/or record a twelfth voltage drop associated with (e.g., across) the fourth transistor 40D being in the open state and the first transistor 40A, the second transistor 40B, and the third transistor 40C being in the closed state. The second op-am 50B may transmit the twelfth voltage drop to the comparator 60.

In various implementations, the comparator 60 may compare the tenth voltage drop with the twelfth voltage drop to generate an eighth comparator output associated with the operational status of the fourth transistor 40D. In accordance with the fourth transistor 40D operating correctly, the eighth comparator output (e.g., high) will indicate that the fourth transistor 40D is in the open state (see, e.g., FIG. 3). In accordance with the fourth transistor 40D including a fault condition (e.g., stuck in the closed state), the eighth comparator output (e.g., low) will indicate that the fourth transistor 40D includes the fault condition.

Subsequently, the controller 30 may activate (e.g., close) the fourth transistor 40D the fifth transistor 40E, and the sixth transistor 40F such that the first op-amp 50A may determine and/or record a thirteenth voltage drop and the second op-amp 50B may determine and/or record a fourteenth voltage drop associated with (e.g., across) the transistors 40A-40D being in the closed state. The first op-amp 50A may transmit the thirteenth voltage drop and the second op-amp 50B may transmit the fourteenth voltage drop to the comparator 60. The comparator 60 may compare the thirteenth voltage drop with the fourteenth voltage drop to generate a ninth comparator output associated with the operational status of the fourth transistor 40D. In accordance with the fourth transistor 40D operating correctly, the ninth comparator output (e.g., low) will indicate that fourth transistor 40D is in the closed state (see, e.g., FIG. 3).

In various implementations, the electrical assembly 10 may perform the health checks while not interrupting electrical current flow from the battery 12 to the electrical load 14. In some examples, the electrical assembly 10 may continuously perform the health checks during operation of the vehicle 20. Alternatively, the electrical assembly 10 may periodically (e.g., at determined time intervals) perform the health checks during operation of the vehicle 20.

Flowchart

Figure 5B:
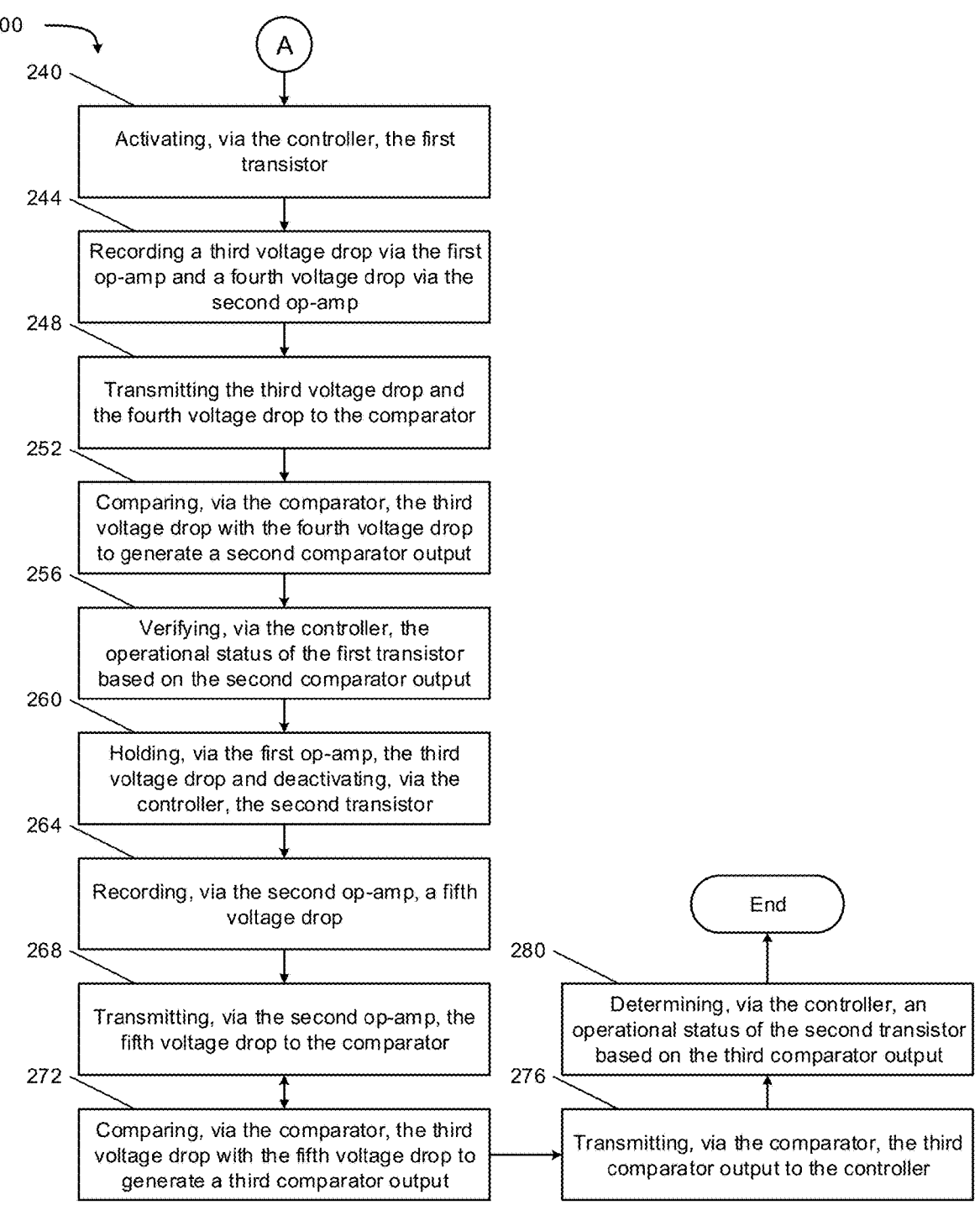

FIGS. 5A and 5B are a flowchart of an example method 200 for operating an electrical assembly 10 configured for connection with a battery 12 and an electrical load 14. The method 200 may begin at 204. At 204, a controller 30 may activate two or more transistors. For example, the controller 30 may activate a first transistor 40A, a second transistor 40B, and a third transistor 40C. The method 200 may proceed to 208. At 208, a first operational amplifier (op-amp) 50A may determine and/or record a first voltage drop associated with (e.g., across) the first transistor 40A, the second transistor 40B, and/or the third transistor 40C being activated. In various implementations, the first op-amp 50A may hold the first voltage drop via a first capacitor 70A and/or a second capacitor 70B. The method 200 may proceed to 212.

At 212, the first op-amp 50A may transmit the first voltage drop to a comparator 60. The method 200 may proceed to 216. At 216, the controller 30 may deactivate one or more transistors. For example, the controller 30 may deactivate the first transistor 40A and/or the third transistor 40C. The method 200 may proceed to 220. At 220, a second op-amp 50B may determine and/or record a second voltage drop associated with the first transistor 40A and/or the third transistor 40C being deactivated and the second transistor 40B being activated. In various implementations, a voltage drop determined and/or recorded via the second op-amp 50B may be associated with a real-time voltage drop of the first transistor 40A, the second transistor 40B, and the third transistor 40C. The method 200 may proceed to 224. At 224, the second op-amp 50B may transmit the second voltage drop to the comparator 60. The method 200 may proceed to 228.

At 228, the comparator 60 may compare the first voltage drop with the second voltage drop to generate a comparator output. The method 200 may proceed to 232. At 232, the comparator 60 may transmit the comparator output to the controller 30. The method 200 may proceed to 236. At 236, the controller 30 may determine an operational status of the first transistor 40A and/or the third transistor 40C based on the comparator output. In various implementations, the operational status may indicate that the first transistor 40A and/or the third transistor 40C is operating correctly or includes a fault condition. The fault condition may be associated with the first transistor 40A and/or the third transistor 40C being stuck in a closed state or an open state. The fault condition may be associated with the first transistor 40A and/or the third transistor 40C having an over-temperature condition, an over-current condition, or an insufficient gate voltage condition. The method 200 may proceed to 240.

At 240, the controller 30 may activate the first transistor 40A and/or the third transistor 40C. The method 200 may proceed to 244. At 244, the first op-amp 50A may determine and/or record a third voltage drop and the second op-amp 50B may determine and/or record a fourth voltage drop associated with (e.g., across) the first transistor 40A, the second transistor 40B, and/or the third transistor 40C being activated. The method 200 may proceed to 248. At 248, the first op-amp 50A may transmit the third voltage drop and the second op-amp 50B may transmit the fourth voltage drop to the comparator 60. The method 200 may proceed to 252. At 252, the comparator 60 may compare the third voltage drop with the fourth voltage drop to generate a second comparator output. The comparator 60 may transmit the second comparator output to the controller 30. The method 200 may proceed to 256.

At 256, the controller 30 may verify (i.e., confirm) the operational status of the first transistor 40A and/or the third transistor 40C based on the second comparator output. The method 200 may proceed to 260. At 260, the first op-amp 50 may hold (e.g., via the first capacitor 70A and the second capacitor 70B) the third voltage drop and the controller 30 may deactivate (e.g., open) the second transistor 40B. The method 200 may proceed to 264. At 264, the second op-amp 50B may determine and/or record a fifth voltage drop associated with (e.g., across) the second transistor 40B being deactivated and the first transistor 40A and/or the third transistor 40C being activated. The method 200 may proceed to 268.

At 268, the second op-amp 50B may transmit the fifth voltage drop to the comparator 60. The method 200 may proceed to 272. At 272, the comparator 60 may compare the third voltage drop with the fifth voltage drop to generate a third comparator output. The method 200 may proceed to 276. At 276, the comparator 60 may transmit the third comparator output to the controller 30. The method 200 may proceed to 280. At 280, the controller 30 may determine an operational status of the second transistor 40B based on the third comparator output. In various implementations, the controller 30 is configured to perform health checks of the first transistor 40A, the second transistor 40B, and/or the third transistor 40C while not interrupting current flow from the battery 12 to the electrical load 14. While the method 200 is generally shown and described herein as performing health checks of three transistors (e.g., the first transistor 40A, the second transistor 40B, and/or a third transistor 40C), it will be appreciated that the method 200 may execute health checks of more than three transistors (e.g., the first transistor 40A, the second transistor 40B, the third transistor 40C, and/or the fourth transistor 40D, among others) within the scope of the present disclosure.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship encompasses a direct relationship where no other intervening elements are present between the first and second elements as well as an indirect relationship where one or more intervening elements are present between the first and second elements.

The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that is coupled with the processor hardware and stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD) or magnetic hard disk drive (HDD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module. The term memory hardware is a subset of the term computer-readable medium.

The apparatuses and methods described in this application may be partially or fully implemented by a special-purpose computer created by configuring a general-purpose computer to execute one or more particular functions embodied in computer programs. Such apparatuses and methods may be described as computerized or computer-implemented apparatuses and methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special-purpose computer, device drivers that interact with particular devices of the special-purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The following Clauses provide an exemplary configuration for an electrical assembly and related methods, as described above.

Clause 1: An electrical assembly configured for connection with a battery and an electrical load, the electrical assembly comprising: a first transistor; a second transistor electrically connected in parallel with the first transistor; a first operational amplifier (op-amp) electrically connected with the first transistor and the second transistor; a second op-amp electrically connected with the first transistor and the second transistor; a comparator electrically connected with the first op-amp and the second op-amp; and a controller electrically connected with the first transistor, the second transistor, and the comparator and configured to: control the first transistor and the second transistor; and determine an operational status of the first transistor and the second transistor based on an output of the comparator.

Clause 2: The electrical assembly of clause 1, wherein the controller is configured to perform health checks of the first transistor and the second transistor while electrical current is flowing from the battery to the electrical load.

Clause 3: The electrical assembly of any of clauses 1 through 2, wherein the operational status indicates that a respective transistor is operating correctly or includes a fault condition.

Clause 4: The electrical assembly of clause 3, wherein the fault condition is associated with the respective transistor being in an open state or a closed state.

Clause 5: The electrical assembly of any of clauses 1 through 4, wherein: the electrical assembly is configured for connection with a vehicle; and the controller is configured to continuously monitor gate voltages and temperatures of the first transistor and the second transistor during operation of the vehicle.

Clause 6: The electrical assembly of any of clauses 1 through 4, further comprising a third transistor connected in parallel with the first transistor and the second transistor, wherein: the controller is electrically connected with the third transistor, and the controller is configured to determine an operational status of the third transistor based on additional outputs from the comparator.

Clause 7: The electrical assembly of any of clauses 1 through 6, further comprising a third transistor electrically connected with the controller and the first op-amp and connected in series with the first transistor and the second transistor.

Clause 8: The electrical assembly of clause 7, further comprising a first capacitor electrically connected with the third transistor and the first op-amp, the first capacitor disposed between the third transistor and the first op-amp.

Clause 9: The electrical assembly of any of clauses 1 through 8, further comprising: a first resistor electrically connected with the second op-amp and the comparator, the first resistor disposed between the second op-amp and the comparator; and a second resistor electrically connected with the first resistor and ground, wherein the first resistor and the second resistor act as a voltage divider during health checks of the first transistor and the second transistor.

Clause 10: A vehicle comprising: the electrical assembly of any of clauses 1 through 9; the battery; and the electrical load, wherein the controller is configured to continuously determine the operational status of the first transistor and the second transistor during operation of the vehicle.

Clause 11: A method of operating an electrical assembly configured for connection with a battery and an electrical load, the method comprising: activating, via a controller, a first transistor and a second transistor; recording, via a first operational amplifier (op-amp), a first voltage drop across the activated first transistor and the activated second transistor; deactivating, via the controller, the first transistor; recording, via a second op-amp, a second voltage drop across the deactivated first transistor and the activated second transistor; comparing, via a comparator, the first voltage drop to the second voltage drop to generate a comparator output; transmitting, via the comparator, the comparator output to the controller; and determining, via the controller, an operational status of the first transistor based on the comparator output.

Clause 12: The method of clause 11, wherein the operational status indicates that the first transistor is operating correctly or includes a fault condition.

Clause 13: The method of clause 12, wherein the fault condition is associated with the first transistor being in a closed state or an open state.

Clause 14: The method of clause 12, wherein the fault condition is associated with the first transistor having an over-temperature condition, an over-current condition, or an insufficient gate voltage condition.

Clause 15: The method of any of clauses 11 through 14, furthering comprising holding, via the first op-amp, the first voltage drop.

Clause 16: The method of any of clauses 11 through 15, wherein the second voltage drop is associated with a real-time voltage drop of the first transistor and the second transistor.

Clause 17: The method of any of clauses 11 through 16, further comprising: activating, via the controller, the first transistor; recording, via the first op-amp, a third voltage drop associated with the first transistor and the second transistor being activated; recording, via the second op-amp, a fourth voltage drop associated with the first transistor and the second transistor being activated; comparing, via the comparator, the third voltage drop with the fourth voltage drop to generate a second comparator output; and verifying, via the controller, the operational status of the first transistor based on the second comparator output.

Clause 18: The method of clause 17, further comprising: holding, via the first op-amp, the third voltage drop; deactivating, via the controller, the second transistor; and recording, via the second op-amp, a fifth voltage drop associated with the second transistor being deactivated and the first transistor being activated.

Clause 19: The method of clause 18, further comprising: comparing, via the comparator, the third voltage drop with the fifth voltage drop to generate a third comparator output; and determining, via the controller, an operational status of the second transistor based on the third comparator output.

Clause 20: The method of any of clauses 11 through 19, wherein the controller is configured to perform health checks of the first transistor and the second transistor while not interrupting current flow from the battery to the electrical load.

Clause 21: The method of any of clauses 11 through 20, wherein: activating, via the controller, the first transistor and the second transistor includes activating, via the controller, a third transistor; recording, via the first op-amp, the first voltage drop across the activated first transistor and the activated second transistor includes recording, via the first op-amp, the first voltage drop across the activated first transistor, the activated second transistor, and the activated third transistor; and recording, via the second op-amp, the second voltage drop across the deactivated first transistor and the activated second transistor, includes recording, via the second op-amp, the second voltage drop across the deactivated first transistor, the activated second transistor, and the activated third transistor.

What is claimed is:

1. An electrical assembly configured for connection with a battery and an electrical load, the electrical assembly comprising:
a first transistor;
a second transistor electrically connected in parallel with the first transistor;
a first operational amplifier (op-amp) electrically connected with the first transistor and the second transistor;
a second op-amp electrically connected with the first transistor and the second transistor;
a comparator electrically connected with the first op-amp and the second op-amp; and
a controller electrically connected with the first transistor, the second transistor, and the comparator and configured to:
control the first transistor and the second transistor; and
determine an operational status of the first transistor and the second transistor based on an output of the comparator,
wherein the electrical assembly is configured for connection with a vehicle, and
wherein the controller is configured to continuously monitor gate voltages and temperatures of the first transistor and the second transistor during operation of the vehicle.

2. The electrical assembly of claim 1 wherein the controller is configured to perform health checks of the first transistor and the second transistor while electrical current is flowing from the battery to the electrical load.

3. The electrical assembly of claim 1 wherein the operational status indicates that a respective transistor is operating correctly or includes a fault condition.

4. The electrical assembly of claim 3 wherein the fault condition is associated with the respective transistor being in an open state or a closed state.

5. An electrical assembly configured for connection with a battery and an electrical load, the electrical assembly comprising:
a first transistor;
a second transistor electrically connected in parallel with the first transistor;
a third transistor connected in parallel with the first transistor and the second transistor;
a first operational amplifier (op-amp) electrically connected with the first transistor and the second transistor;
a second op-amp electrically connected with the first transistor and the second transistor;
a comparator electrically connected with the first op-amp and the second op-amp; and
a controller electrically connected with the first transistor, the second transistor, the third transistor and the comparator and configured to:
control the first transistor and the second transistor;
determine an operational status of the first transistor and the second transistor based on an output of the comparator; and
determine an operational status of the third transistor based on additional outputs from the comparator.

6. An electrical assembly configured for connection with a battery and an electrical load, the electrical assembly comprising:
a first transistor;
a second transistor electrically connected in parallel with the first transistor;
a first operational amplifier (op-amp) electrically connected with the first transistor and the second transistor;
a second op-amp electrically connected with the first transistor and the second transistor;
a comparator electrically connected with the first op-amp and the second op-amp;
a controller electrically connected with the first transistor, the second transistor, and the comparator and configured to:
control the first transistor and the second transistor; and
determine an operational status of the first transistor and the second transistor based on an output of the comparator; and
a third transistor electrically connected with the controller and the first op-amp and connected in series with the first transistor and the second transistor.

7. The electrical assembly of claim 6 further comprising a first capacitor electrically connected with the third transistor and the first op-amp, the first capacitor disposed between the third transistor and the first op-amp.

8. An electrical assembly configured for connection with a battery and an electrical load, the electrical assembly comprising:
a first transistor;
a second transistor electrically connected in parallel with the first transistor;
a first operational amplifier (op-amp) electrically connected with the first transistor and the second transistor;

a second op-amp electrically connected with the first transistor and the second transistor;

a comparator electrically connected with the first op-amp and the second op-amp;

a controller electrically connected with the first transistor, the second transistor, and the comparator and configured to:

control the first transistor and the second transistor; and determine an operational status of the first transistor and the second transistor based on an output of the comparator;

a first resistor electrically connected with the second op-amp and the comparator, the first resistor disposed between the second op-amp and the comparator; and a second resistor electrically connected with the first resistor and ground, wherein the first resistor and the second resistor act as a voltage divider during health checks of the first transistor and the second transistor.

9. A vehicle comprising:

the electrical assembly of claim 1;

the battery; and the electrical load, wherein the controller is configured to continuously determine the operational status of the first transistor and the second transistor during operation of the vehicle.

10. A method of operating an electrical assembly configured for connection with a battery and an electrical load, the method comprising:

providing a first transistor and a second transistor electrically connected in parallel with the first transistor;

providing a first operational amplifier (op-amp) electrically connected with the first transistor and the second transistor;

providing a second op-amp electrically connected to the first transistor and the second transistor;

providing a comparator electrically connected with the first op-amp and the second op-amp;

providing a controller electrically connected with the first transistor, the second transistor, and the comparator;

controlling, via the controller, the first transistor and the second transistor; and determining, via the controller, an operational status of the first transistor and the second transistor based on an output of the comparator, wherein the electrical assembly is configured for connection with a vehicle, and wherein the method further includes continuously monitoring, via the controller, gate voltages and temperatures of the first transistor and the second transistor during operation of the vehicle.

11. The method of claim 10 further comprising performing, via the controller, health checks of the first transistor and the second transistor while electrical current is flowing from the battery to the electrical load.

12. The method of claim 10 wherein the operational status indicates that a respective transistor is operating correctly or includes a fault condition.

13. The method of claim 12 wherein the fault condition is associated with the respective transistor being in an open state or a closed state.

14. The method of claim 10 further comprising:

providing a third transistor connected in parallel with the first transistor and the second transistor, wherein the controller is electrically connected with the third transistor; and determining, via the controller, an operational status of the third transistor based on additional outputs from the comparator.

15. The method of claim 10 further comprising providing a third transistor electrically connected with the controller and the first op-amp and connected in series with the first transistor and the second transistor.

16. The method of claim 15 further comprising providing a first capacitor electrically connected with the third transistor and the first op-amp, wherein the first capacitor is disposed between the third transistor and the first op-amp.

17. The method of claim 10 further comprising:

providing a first resistor electrically connected with the second op-amp and the comparator, wherein the first resistor is disposed between the second op-amp and the comparator; and providing a second resistor electrically connected with the first resistor and ground, wherein the first resistor and the second resistor act as a voltage divider during health checks of the first transistor and the second transistor.

18. The method of claim 10 wherein the controller is configured to perform health checks of the first transistor and the second transistor while not interrupting current flow from the battery to the electrical load.

* * * * *